(12) United States Patent
Li et al.

(10) Patent No.: US 12,388,249 B2
(45) Date of Patent: Aug. 12, 2025

(54) LEAKAGE CURRENT DETECTION AND INTERRUPTION DEVICE

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 146 days.

(21) Appl. No.: 18/484,174

(22) Filed: Oct. 10, 2023

(65) Prior Publication Data
US 2025/0096552 A1 Mar. 20, 2025

(30) Foreign Application Priority Data

Sep. 19, 2023 (CN) .......................... 202311207892.8
Sep. 19, 2023 (CN) .......................... 202322543010.7

(51) Int. Cl.
*H02H 3/00* (2006.01)
*G01R 31/52* (2020.01)
*H02H 1/00* (2006.01)
*H02H 3/08* (2006.01)

(52) U.S. Cl.
CPC .............. *H02H 3/08* (2013.01); *G01R 31/52* (2020.01); *H02H 1/0007* (2013.01)

(58) Field of Classification Search
None
See application file for complete search history.

(56) References Cited

U.S. PATENT DOCUMENTS

| 10,571,526 B2 * | 2/2020 | Li | .......................... H02H 3/338 |
| 10,615,588 B2 * | 4/2020 | Li | .......................... H01H 9/54 |
| 2024/0426941 A1 * | 12/2024 | Li | .......................... G01R 31/52 |

* cited by examiner

*Primary Examiner* — Stephen W Jackson
(74) *Attorney, Agent, or Firm* — Chen Yoshimura LLP (57) ABSTRACT

A leakage current detection and interruption device includes a switch module for connecting and disconnecting an electrical connection between input and output ends of current carrying lines; a leakage current detection module coupled to the current carrying lines, for detecting a leakage current signal on the current carrying lines and generating a detected signal in response thereto; a leakage current processing module coupled to the leakage current detection module, for receiving the detected signal and generating a leakage fault signal based on the amplitude and frequency of the detected signal; and a drive module coupled to the switch module and the leakage current processing module, for receiving the leakage fault signal and driving the switch module to disconnect the electrical connection in response thereto.

10 Claims, 5 Drawing Sheets

Fig. 5

LEAKAGE CURRENT DETECTION AND INTERRUPTION DEVICE

BACKGROUND OF THE INVENTION

This invention relates to safety protection for electrical appliances, and in particular, it relates to a leakage current detection and interruption device.

With the increased use of home electrical appliances, more and more attention is paid to the safety of electrical appliances. Many home electrical appliances are now equipped with leakage current detection and interruption functions, such as power plugs with leakage current detection and interruption (LCDI) device. Due to the large varieties of home electrical appliances on the market and their complex internal circuits, their main circuits may produce electrical currents of different frequencies. High frequency currents are comparatively less harmful to humans than low frequency currents, but during actual use, high frequency currents are more likely than low frequency currents to produce parasitic currents relative to ground, and more likely to interfere with operation of the leakage current detection and interruption device. They may cause erroneous action such as false tripping, which can affect user experience and cause safety threat.

SUMMARY OF THE INVENTION

Therefore, there is a need for an improved leakage current detection and interruption device which solves the problem of false tripping in operation environments where high frequency currents exist, thereby improving user experience and reduce safety threat.

To solve some of the problems of conventional leakage current detection and interruption devices, the present invention provides a leakage current detection and interruption device, which includes: a switch module, coupled on a plurality of current carrying lines between an input end and an output end, configured to connect or disconnect an electrical connection between the input end and the output end; a leakage current detection module, coupled to the current carrying lines, configured to detect a leakage current signal on the current carrying lines and to generate a detected signal in response thereto; a leakage current processing module, coupled to the leakage current detection module, configured to receive the detected signal, determine a target gain based on a frequency of the detected signal, gain-process an amplitude of the detected signal using the target gain, compare the gain-processed amplitude to a predetermined threshold, and generate a leakage fault signal based on the comparison; and a drive module, coupled to the switch module and the leakage current processing module, configured to receive the leakage fault signal, and to drive the switch module to disconnect the electrical connection in response to the leakage fault signal.

In some embodiments, the leakage current processing module includes: a first leakage current processing unit, configured to receive and process a first signal which is a portion of the detected signal within a first frequency range; and a second leakage current processing unit, configured to receive and process a second signal which is another portion of the detected signal within a second frequency range.

In some embodiments, the first leakage current processing unit includes a leakage current processing chip, and the second leakage current processing unit includes a microprocessor unit.

In some embodiments, the leakage current detection module includes a first filter circuit, configured to filter the detected signal and then input it to the leakage current processing chip, wherein the leakage current processing chip is configured to gain-process the filtered signal and then input it to the microprocessor unit.

In some embodiments, the leakage current detection module includes an operational amplifier and a second filter circuit, wherein the operational amplifier is configured to amplify the detected signal and input the amplified signal to the microprocessor unit, wherein the second filter circuit is configured to filter the amplified signal and input the filtered signal to the leakage current processing chip.

In some embodiments, the leakage current detection and interruption device further includes a self-test module, coupled to the leakage current detection module and the drive module, configured to generate a self-test signal and input it to the leakage current detection module, and to control the drive module to drive the switch module to disconnect the electrical connection in response to a malfunction of the leakage current detection module, the leakage current processing module, or the drive module.

In some embodiments, the current carrying lines include a first current carrying line connected to a hot line of a power source and a second current carrying line connected to a neutral line of the power source, wherein the drive module includes a trip solenoid and a silicon controlled rectifier, a first end of the trip solenoid is couple to the first current carrying line, a second end of the trip solenoid is couple to the silicon controlled rectifier, wherein the self-test module includes a protection diode and a protection resistor, the second end of the trip solenoid is coupled to a control gate of the silicon controlled rectifier via the protection diode and the protection resistor, wherein when the leakage current processing module malfunctions, a current flows through a path from the first current carrying line via the trip solenoid, the protection diode and the protection resistor to trigger the silicon controlled rectifier to conduct, which in turn drives the switch module to disconnect the electrical connection between the input and output ends.

In some embodiments, the self-test module includes a microprocessor unit, coupled to the leakage current detection module, configured to periodically outputs a simulated leakage current signal to the leakage current detection module and to receive a corresponding feedback signal from the leakage current detection module, wherein in response to a malfunction in the leakage current detection module and/or the leakage current processing module, the microprocessor unit outputs a self-test fault signal to control the drive module to drive the switch module to disconnect the electrical connection between the input and output ends.

In some embodiments, the self-test module further includes a self-test resistor, coupled to the microprocessor unit, configured to pre-adjust a value of the simulated leakage current signal.

In some embodiments, the leakage current processing module includes a leakage current processing chip, configured to: receive the detected signal, determine the target gain based on the frequency of the detected signal, gain-process the amplitude of the detected signal using the target gain, compare the gain-processed amplitude to the predetermined threshold, and generate the leakage fault signal based on the comparison.

The leakage current detection and interruption device according to embodiments of the present invention can apply different gains to the amplitude of the detected leakage current signal depending on the frequency of the signal, so that the device is more sensitive to low frequency leakage currents and less sensitive to high frequency leakage currents. This effectively solves the problem of false tripping in operation environments where high frequency currents exist, thereby improving user experience and reduce safety threat.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a leakage current detection and interruption device, which can process detected leakage current signal by applying different gains to the amplitude of the signal depending on the frequency of the signal. As a result, the leakage current detection and interruption device is more sensitive to low frequency leakage currents and less sensitive to high frequency leakage currents. Therefore, the device solves the problem of false tripping in operation environments where high frequency currents exist, thereby improving user experience and reduce safety threat. The leakage current detection and interruption device has a simple structure, is low cost and safe.

Figure 1:
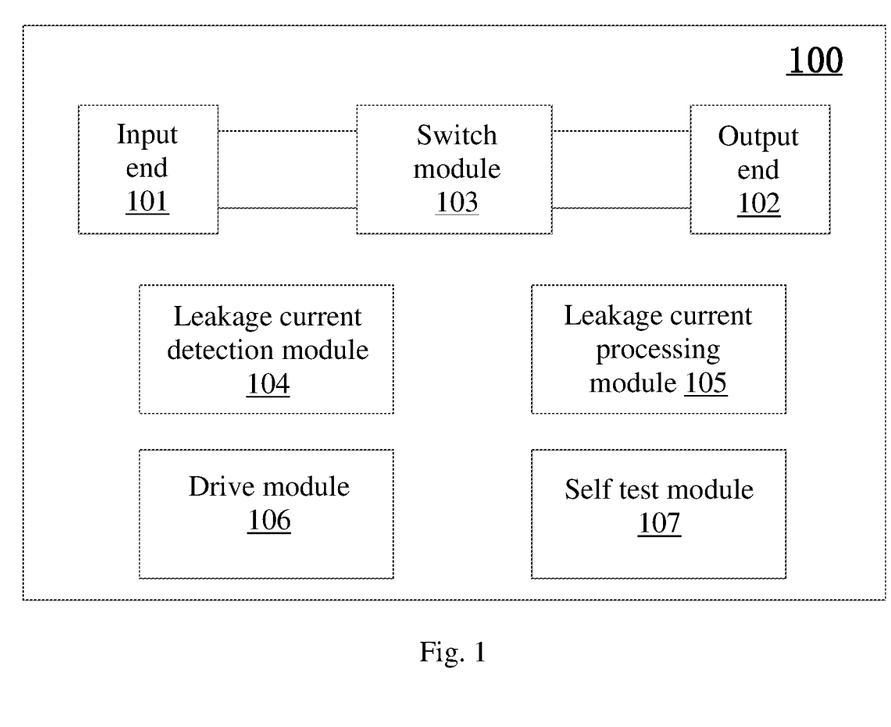
FIG. 1 is a block diagram illustrating a leakage current detection and interruption device according to embodiments of the present invention.

FIG. 1 is a block diagram illustrating a leakage current detection and interruption device according to some embodiments of the present invention. As shown in FIG. 1, the electrical fault detection and interruption device 100 includes a switch module 103, a leakage current detection module 104, a leakage current processing module 105, and a drive module 106. The switch module 103 is coupled between the input end 101 and output end 102 of the power supply lines, and controls the electrical connection and disconnection between the input and output ends. The leakage current detection module 104 is coupled to the power supply lines and functions to detect a leakage current signal on the power supply lines, and to output a detected signal in response thereto. The leakage current processing module 105 is coupled to the leakage current detection module 104 to receive and process the detected signal, and functions to determine a target gain based on the frequency of the detected signal, gain-process the amplitude of the detected signal using the target gain, compare the gain-processed amplitude to a predetermined threshold, and generate a leakage fault signal based on the comparison. The drive module 106 is coupled to the leakage current processing module 105 and the switch module 103, and functions to receive the leakage fault signal and to drive the switch module 103 to disconnect electrical power between the input end 101 and output end 102 in response to the leakage fault signal.

It should be noted that the leakage current processing module 105 may be implemented by using existing hardware such as leakage signal processing chips, and adjusting the setting or program within the chips to carry out the above-described signal processing steps including receiving the detected signal, gain-processing the amplitude of the detected signal using different target gains corresponding to different frequencies of the detected signal, comparing the gain-processed signal to the predetermined threshold, and generating the leakage fault signal based on the comparison. In other embodiments, the leakage current processing module may be implemented using combinations of hardware such as selection switch, amplifier, comparator, etc. to perform the above signal processing steps.

In some embodiments, the leakage current detection and interruption device 100 further includes a self-test module 107. The self-test module 107 is coupled to the leakage current detection module 104 and the drive module 106; it functions to generate a self-test signal and provide it to the leakage current detection module 104, and when the leakage current detection module 104, the leakage current processing module 105, and/or the drive module 106 malfunctions, to control the drive module 106 to drive the switch module 103 to disconnect electrical power between the input and output ends.

In some embodiments, the leakage current processing module 105 includes a first leakage current processing unit and a second leakage current processing unit. The first leakage current processing unit is configured to receive and process a first signal which is a portion of the detected signal (first voltage signal) within a first frequency range, and the second leakage current processing unit is configured to receive and process a second signal which is another portion of the detected signal within a second frequency range. By performing different processing to the signals, the leakage current detection and interruption device meets the requirements of different protection threshold and different reaction response time for leakage currents of different frequencies. For example, in one particular example, the predetermined protection threshold is 6 mA, and the first leakage current processing unit is configured to process leakage current having a frequency of 60 Hz, and to generate a leakage fault signal when the amplitude of the 60 Hz leakage current is greater than 6 mA. The second leakage current processing unit may be configured to process leakage current signals having a frequency of 1 kHz, 10 kHz, 50 kHz, and/or 150 kHz, or other relatively high frequencies. It may be configured to generate a leakage fault signal when the amplitude of the 1 kHz leakage current divided by 1.2 is greater than 6 mA, or when the amplitude of the 10 kHz leakage current divided by 5 is greater than 6 mA, etc. The gain (division factor) for the other frequency signal may be provided accordingly. In some embodiments, the first leakage current processing unit is a leakage signal processing chip, and the second leakage current processing unit is a microprocessor unit. The leakage signal processing chip is able to control the switch module 103 to disconnect the power within a relatively short time (e.g., within 40 ms) after the leakage current is detected, providing a fast circuit interruption response which enhances safety.

In some embodiments, the leakage current detection module 104 includes a first filter circuit, where the detected signal is filtered by the first filter circuit and then inputted to the leakage signal processing chip, amplified and processed by the chip, and then inputted into the microprocessor unit. In some other embodiments, the leakage current detection module 104 includes an operational amplifier (op-amp) circuit and a second filter circuit; the detected signal is amplified by the op-amp and then inputted into the microprocessor unit, and also amplified by the op-amp and filtered by the second filter circuit and then inputted into the leakage signal processing chip. These two types of devices may be suited for different application scenarios. For example, leakage current detection and interruption devices with the first filter circuit are more suitable for applications where the frequency range of the leakage current protection is relatively small, and leakage current detection and interruption devices with the second filter circuit are more suitable for applications where the frequency range of the leakage current protection is relatively large.

Figure 2:
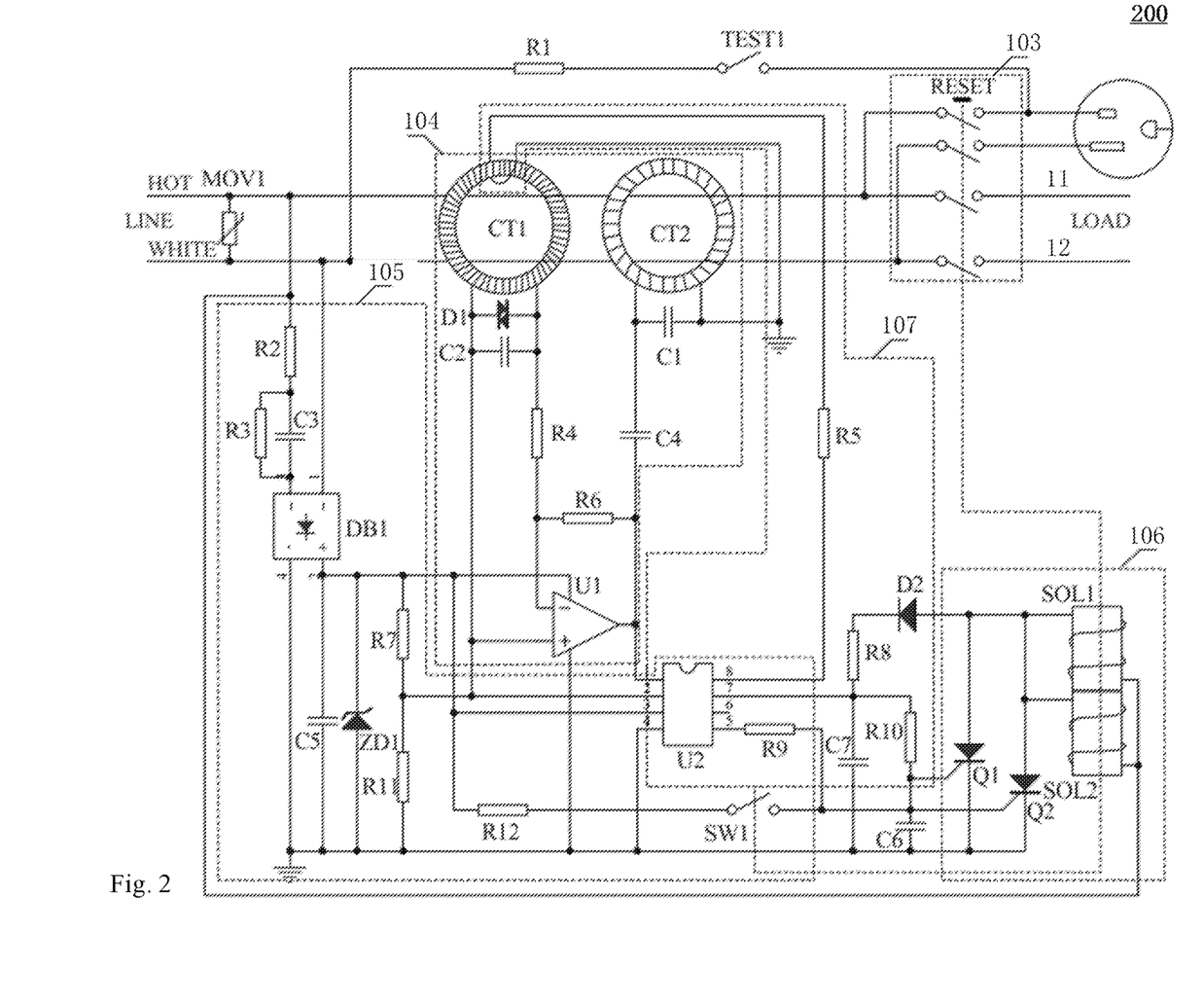
FIG. 2 is a circuit diagram illustrating a leakage current detection and interruption device according to a first embodiment of the present invention.

FIG. 2 is a circuit diagram illustrating a leakage current detection and interruption device according to a first embodiment of the present invention. As shown in FIG. 2, the leakage current detection and interruption device 200 includes a switch module 103, a leakage current detection module 104, a leakage current processing module 105, a drive module 106, and a self-test module 107. The power lines include a first current carrying line 11 and a second current carrying line 12. The switch module 103 includes a reset switch RESET which controls the electrical connection of the first current carrying line 11 and second current carrying line 12 between the input end and output end. The leakage current detection module 104 includes zero sequence current transformers CT1 and CT2 through which the first and second current carrying lines 11 and 12 pass, and op-amp U1 and its peripheral circuit, configured to detect the leakage current on the first and second current carrying lines 11 and 12 and to output a corresponding detected signal after amplification by the op-amp U1. The leakage current processing module 105 employs a microprocessor unit U2 to: receive the detected signal, determine a target gain based on the frequency of the detected signal, gain-process the amplitude of the detected signal using the target gain, compare the gain-processed signal to a predetermined threshold, and generate a leakage fault signal based on the comparison. The leakage current processing module 105 further includes a power supply circuit (including resistor R2, capacitor C3, rectifier DB1 and voltage regulator ZD1, coupled to the input end of the first current carrying line 11) to supply power to the microprocessor unit U2. The drive module 106 includes trip solenoids SOL1 and SOL2 and silicon controlled rectifiers Q1 and Q2, where solenoids SOL1 and SOL2 serve as spare elements of each other, and silicon controlled rectifiers Q1 and Q2 serve as spare elements of each other. By changing the conductivity of silicon controlled rectifiers Q1 and Q2 to control the currents flowing through solenoids SOL1 and SOL2, the solenoids drive the open/close of the switch module 103. The self-test module 107 includes the microprocessor unit U2 and a self-test resistor R5. Microprocessor unit U2 periodically generates a simulated leakage current signal at its pin 8, which is coupled to current transformer CT1 via resistor R5, and receives the corresponding feedback leakage current signal from the leakage current detection module 104. When the leakage current detection module 104 and/or the leakage current processing module 105 has a malfunction, the microprocessor unit U2 outputs a self-test fault signal, which controls the drive module 106 to drive the switch module 103 to disconnect the electrical connection between the input and output ends. Alternatively, rather than using microprocessor unit U2, the self-test module 107 may use another separate processor chip to perform the above described self-test function.

When the device 100 is functioning normally, the first and second current carrying lines 11 and 12 are respectively connected to the hot and neutral lines of the power source, and the switch module 103 is in the reset condition (i.e. closed condition); the input and output ends of the first and second current carrying lines 11 and 12 are electrically connected, and an auxiliary reset switch SW1 is open (the auxiliary reset switch SW1 is a part of the leakage current processing module 105 and is mechanically linked to the reset switch). In this condition, a current flows through the path 11-R2-C3-DB1-ZD1 to provide a stable working power for the microprocessor unit U2 and op-amp U1. In this state, pins 7 and 5 of the microprocessor unit U2 output a low voltage level.

When the switch module 103 is open (tripped), and the user manually depresses an external reset button on the device to close the auxiliary reset switch SW1, a current flows through the path DB1-R12-SW1, and silicon controlled rectifiers Q1 and Q2 are triggered to conduct. This causes sufficient large currents to flow through solenoids SOL1 and SOL2, which in turn drive the switch module 103 to unlock the trip mechanism and establish the electrical connection between the input and output ends. Thus, the device is reset, and the auxiliary reset switch SW1 is open again (when the user releases the reset button).

When the first current carrying line 11 (L) and/or second current carrying line 12 (N) has a leakage, the current transformer CT1 or CT2 detects the leakage and generates a leakage current signal. The leakage current signal is amplified by the op-amp U1, which outputs the detected signal (first voltage signal). The detected signal is inputted to the AD conversion terminal (pin 1) of microprocessor unit U2. Microprocessor unit U2 processes the detected signal to obtain its frequency and amplitude, gain-processes the amplitude using a gain corresponding to the frequency to calculate an equivalent leakage current value, and then compares the equivalent leakage current value to a pre-stored equivalent tripping threshold. (For example, when the required tripping threshold is 6 mA for 60 Hz leakage current, 7.2 mA for 1 kHz leakage current, and 30 mA for 10 KHz leakage current, the microprocessor unit U2 stores an equivalent tripping threshold 6 mA. When the frequency of the detected leakage current is 60 Hz, its amplitude is not attenuated by microprocessor unit U2; when the frequency of the detected leakage current is 1 kHz, its amplitude is attenuated by a division factor of 1.2 to calculate the equivalent leakage current value; when the frequency of the detected leakage current is 10 kHz, its amplitude is attenuated by a division factor of 5; etc. The calculated equivalent leakage current value is compared to the pre-stored equivalent tripping threshold of 6 mA.) When the calculate equivalent leakage current value exceeds the equivalent tripping threshold, microprocessor unit U2 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends.

Further, the leakage current detection and interruption device 200 performs self-test through the self-test module 107. More specifically, microprocessor unit U2 periodically outputs a high voltage level at its pin 8, which is coupled via self-test resistor R5 to current transformer CT1 and then to ground to form a simulated leakage current signal. Under normal operation condition, current transformer CT1 detects the simulated leakage current, and the detected signal is amplified by op-amp U1 and then coupled to microprocessor unit U2 as the feedback signal. As microprocessor unit U2 receives the feedback signal, its pin 7 is maintained at a low voltage level, so that silicon controlled rectifiers Q1 and Q2 are not triggered to conduct, and the switch module 103 remains closed (connected). When current transformer CT1 and/or op-amp U1 or other components malfunction, microprocessor unit U2 does not received the feedback signal. As a result, its pin 7 outputs a high voltage level, triggering silicon controlled rectifiers Q1 and Q2 to conduct, which in turn drives switch module 103 to disconnect the electrical connection between the input and output ends. When any elements in the power supply circuit including resistor R2, capacitor C3, rectifier DB1 and/or voltage regulator ZD1 malfunction so that microprocessor unit U2 cannot operate, or when microprocessor unit U2 itself malfunctions, its pin 7 cannot output the low voltage level. As a result, a current flows from first current carrying line 11 through solenoid SOL1 and/or SOL2, protection diode D2, and protection resistor R8, to trigger silicon controlled rectifier Q1 and/or Q2 to conduct, so that sufficiently large currents flow through solenoids SOL1 and SOL2, thereby generating a magnetic field to drive the switch module 103 to disconnect the electrical power between the input and output ends.

Figure 3:
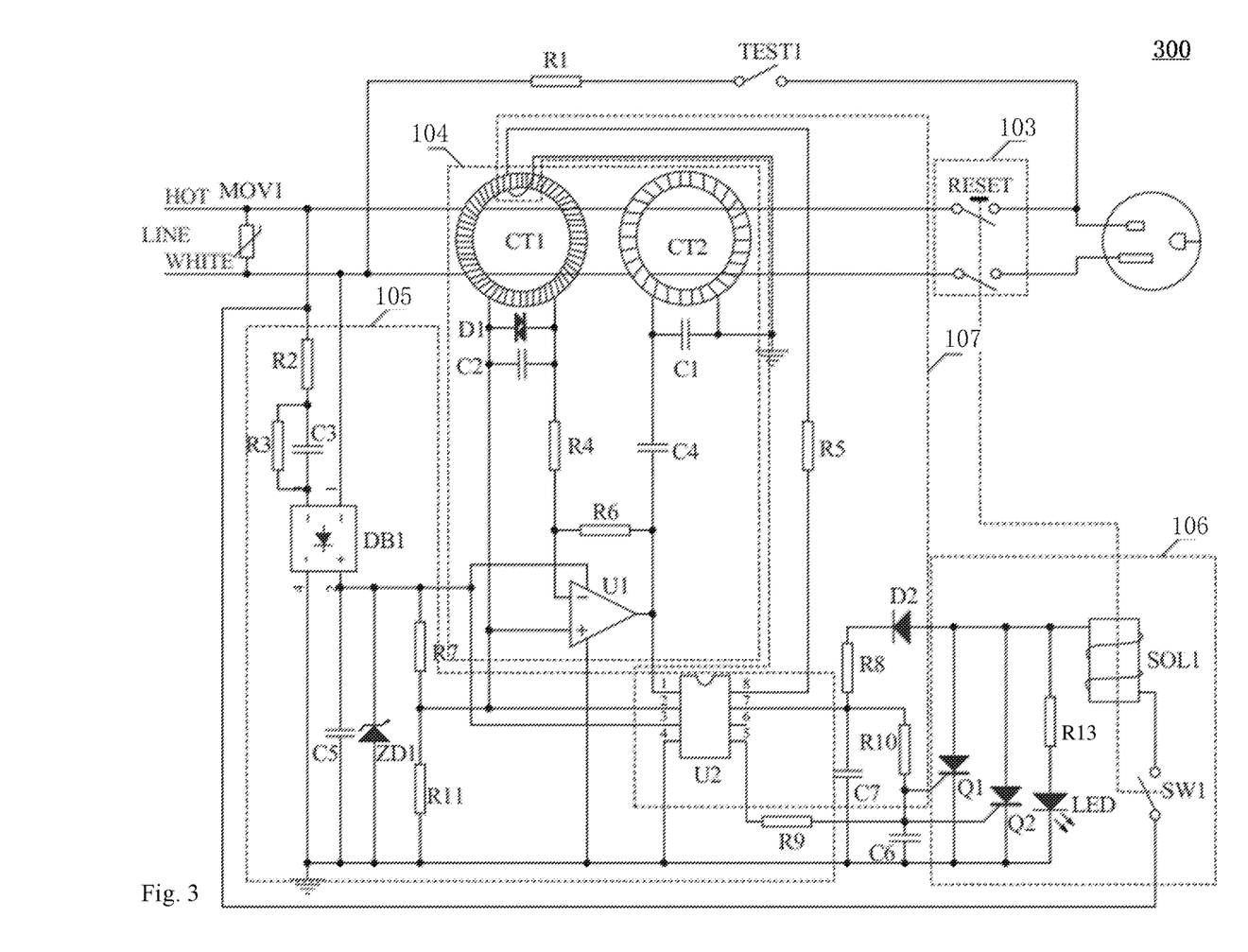
FIG. 3 is a circuit diagram illustrating a leakage current detection and interruption device according to a second embodiment of the present invention.

FIG. 3 is a circuit diagram illustrating a leakage current detection and interruption device according to a second embodiment of the present invention. As shown in FIG. 3, the leakage current detection and interruption device 300 includes a switch module 103, a leakage current detection module 104, a leakage current processing module 105, a drive module 106 and s self-test module 107. The operating principles of the circuit of FIG. 3 are similar to those of the circuit of FIG. 2, and the descriptions below focus on their differences. One difference between the circuits of FIG. 3 and FIG. 2 is that, in FIG. 2, the output end includes a power receptacle and a load terminal, while in FIG. 3, the output end only includes a power receptacle. These devices are respectively suitable for different types of products. The device in FIG. 2, which is for use directly with an electrical load, typically has higher leakage current protection requirements than the device in FIG. 3. Thus, in the circuit of FIG. 3, the auxiliary reset switch SW1 (a normally closed switch) is coupled in series between the input end of first current carrying line 11 and trip solenoid SOL1. Further, the drive module 106 in FIG. 3 includes only one solenoid SOL1. The leakage current detection and interruption device 300 further includes a fault indicator circuit R13 and a light emitting diode LED, where resistor R13 and light emitting diode LED are coupled in series, the first end of resistor R13 is coupled to solenoid SOL, the second end of resistor R13 is coupled to the input end of light emitting diode LED, and the output end of light emitting diode LED is coupled to ground. When the device malfunctions, light emitting diode LED does not emit light, indicating a malfunction condition.

Figure 4:
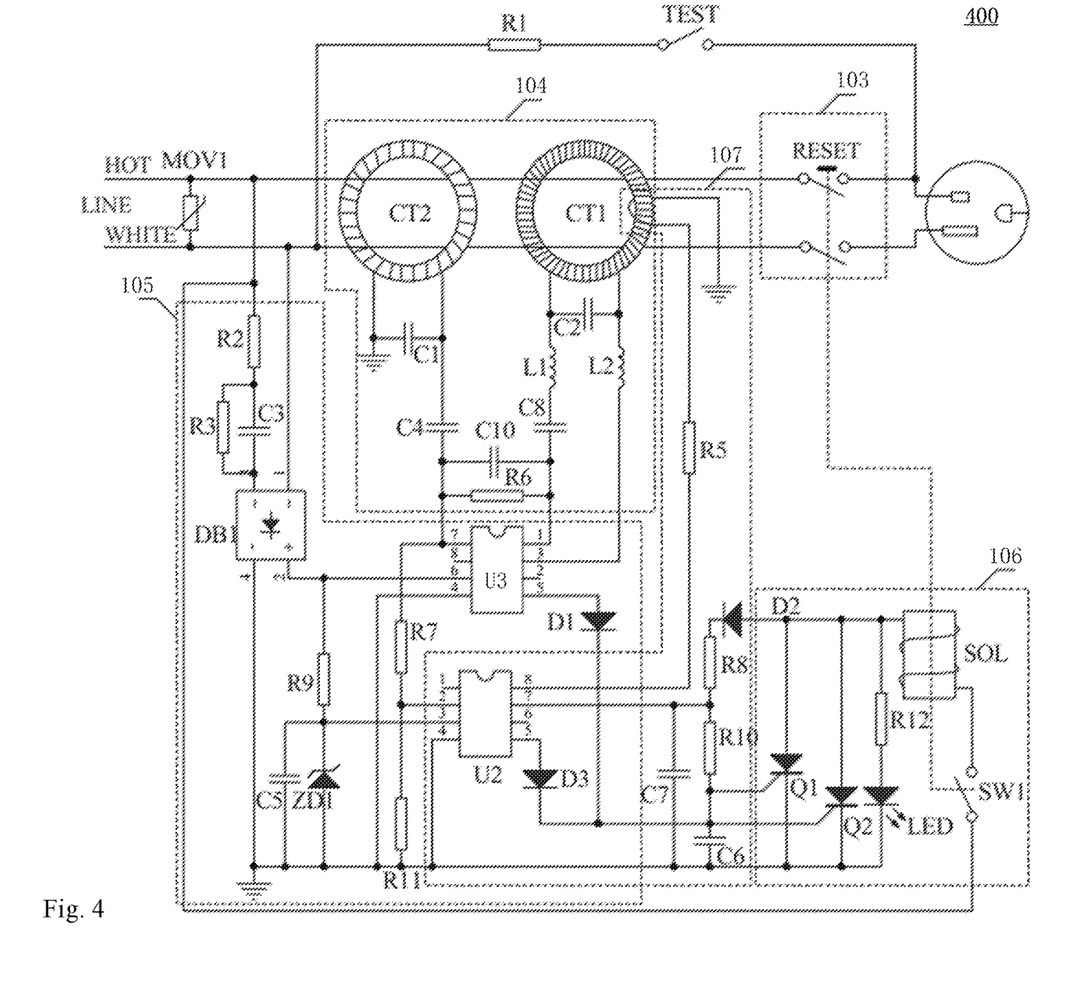
FIG. 4 is a circuit diagram illustrating a leakage current detection and interruption device according to a third embodiment of the present invention.

FIG. 4 is a circuit diagram illustrating a leakage current detection and interruption device according to a third embodiment of the present invention. As shown in FIG. 4, the leakage current detection and interruption device 400 includes a switch module 103, a leakage current detection module 104, a leakage current processing module 105, a drive module 106 and s self-test module 107. The operating principles of the circuit of FIG. 4 are similar to those of the circuit of FIG. 2, and the descriptions below focus on their differences. The leakage current detection module 104 in FIG. 4 does not include an op-amp U1, but its leakage current processing module 105 includes another leakage current processing chip U3, which perform amplification of the leakage current signal, as well as processing of a portion of the first voltage signal that is within a particular frequency range. During normal operation, a current flows through the path R2-C3-DB1-ZD1 to provide a stable power supply for microprocessor unit U2 and leakage current processing chip U3. Further, the leakage current detection module 104 additionally includes a first filter circuit. More specifically, the first end of the secondary stage of current transformer CT1 is coupled to pin 1 of leakage current processing chip U3 via inductor L1 and capacitor C8, the second end of the secondary stage of current transformer CT1 is coupled to pin 3 of leakage current processing chip U3 via inductor L2, and capacitor C10 is coupled between pin 7 and pin 1 of leakage current processing chip U3. Inductor L1 and capacitor C8 form the first filter circuit to filter the detected leakage current signal before inputting it to leakage current processing chip U3.

When the first current carrying line 11 (L) and/or second current carrying line 12 (N) has a leakage, current transformer CT1 or CT2 detects the leakage and generates a leakage current signal. The leakage current signal is amplified by leakage current processing chip U3, which outputs the first voltage signal to the AD conversion terminal (pin 2) of microprocessor unit U2. The microprocessor unit U2 processes the first voltage signal to obtain its frequency and amplitude, gain-processes the amplitude using a gain corresponding to the frequency to calculate an equivalent leakage current value, and then compares the equivalent leakage current value to the pre-stored equivalent tripping threshold. When the equivalent leakage current value exceeds the equivalent tripping threshold, microprocessor unit U2 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends. Moreover, a portion of the first voltage signal that is within a particular frequency range is processed by internal circuits of leakage current processing chip U3: when the amplitude of that portion of the first voltage signal exceeds a pre-set threshold, leakage current processing chip U3 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends.

Figure 5:
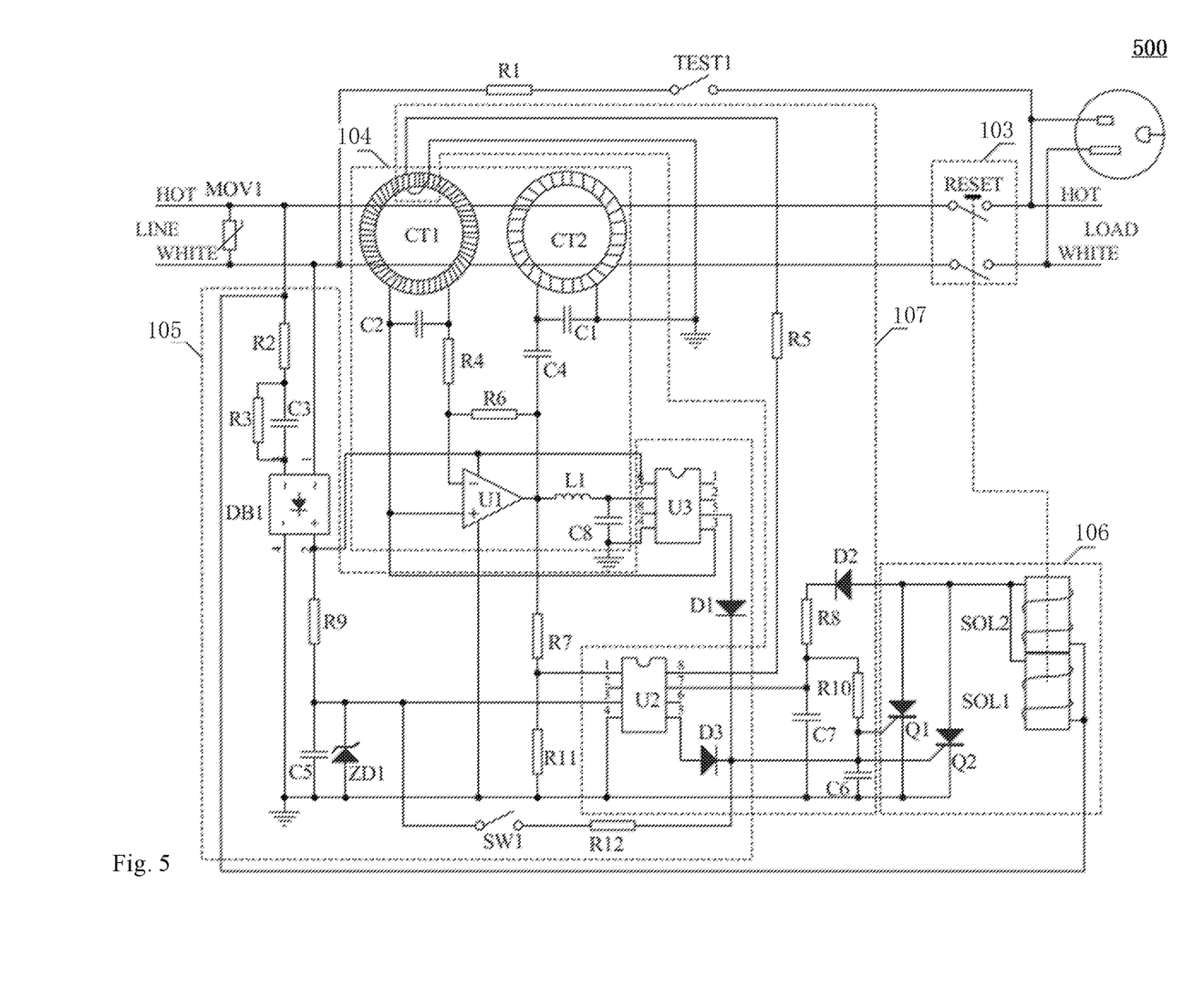
FIG. 5 is a circuit diagram illustrating a leakage current detection and interruption device according to a fourth embodiment of the present invention.

FIG. 5 is a circuit diagram illustrating a leakage current detection and interruption device according to a fourth embodiment of the present invention. As shown in FIG. 5, the leakage current detection and interruption device 500 includes a switch module 103, a leakage current detection module 104, a leakage current processing module 105, a drive module 106 and s self-test module 107. The operating principles of the circuit of FIG. 4 are similar to those of the circuit of FIG. 2, and the descriptions below focus on their differences. The leakage current detection module 104 of FIG. 5 additionally includes a second filter circuit and a leakage current processing chip U3. The second filter circuit includes inductor L1 and capacitor C8; the first end of inductor L1 is coupled to the output of the op-amp U1, the second end of inductor L1 is coupled to ground via capacitor C8, and capacitor C8 is coupled between pins 7 and 8 of leakage current processing chip U3. Pin 6 of leakage current processing chip U3 is its power supply terminal (power is supplied to U3 from the input end of the first current carrying line via R2. C3 and DB1). During normal operation, a current flows through the path R2-C3-DB1-ZD1 to provide a stable working power for the microprocessor unit U2, op-amp U1, and leakage current processing chip U3.

When the first current carrying line 11 and/or second current carrying line 12 has a leakage, the current transformer CT1 detects the leakage and generates a leakage current signal. The leakage current signal is amplified by op-amp U1, which outputs the first voltage signal to the AD conversion terminal (pin 1) of microprocessor unit U2. Microprocessor unit U2 processes the first voltage signal to obtain its frequency and amplitude, gain-processes the amplitude using a gain corresponding to the frequency to obtain an equivalent leakage current value, and then compares the equivalent leakage current value to the pre-stored equivalent tripping threshold. When the equivalent leakage current value exceeds the equivalent tripping threshold, microprocessor unit U2 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends. Moreover, a portion of the first voltage signal that is within a particular frequency range is processed by internal circuits of leakage current processing chip U3: when the amplitude of that portion of the first voltage signal exceeds a pre-set threshold, leakage current processing chip U3 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends. Further, the first voltage signal, after filtering by the filter circuit L1 and C8, is processed by leakage current processing chip U3: when the amplitude of the filtered first voltage signal exceeds a pre-set threshold, leakage current processing chip U3 outputs a high voltage level at pin 5, triggering silicon controlled rectifiers Q1 and Q2 to conduct, so that sufficiently large currents flow through solenoids SOL1 and SOL2, thereby generating a magnetic field to drive the switch module 103 to disconnect the electrical power between the input and output ends.

Embodiments of the present invention are described above. It will be apparent to those skilled in the art that various modifications may be made without departing from the spirit or scope of the invention. While the operation principles of the various embodiments are described, various structures, arrangements, proportions, devices, materials and components may be modified to adapt to particular environments or application requirements without departing from the spirit or scope of the invention. Such modifications of other modifications are within the scope of the present invention. Thus, the above descriptions do not limit the scope of the invention. While the advantages of various embodiments and the solutions to various technical problems are described, the advantages and solutions and any considerations that lead to these advantages or solutions, or other variations of solutions may not be critical, necessarily or inherent. Terms such as "include" or variations of such terms used in the above disclosure should be interpreted as being non-exclusive. The process, method, article of manufacture or apparatus that includes any listed elements may include not only these elements, but other elements not specifically listed or outside of these process, method, article of manufacture or apparatus. Further, terms such as "couple" or variations of such terms used in the above disclosure should be interpreted to include physical coupling, electrical coupling, magnetic coupling, optical coupling, communicative coupling, functional coupling and/or any other form of coupling.

It will be apparent to those skilled in the art that various modifications may be made to the above described embodiments without departing from the spirit or scope of the invention. Thus, it is intended that the scope of the invention is defined by the appended claims.

The invention claimed is:

1. A leakage current detection and interruption device, comprising:
   a plurality of current carrying lines having an input end and an output end;
   a switch module, coupled on the plurality of current carrying lines between the input end and the output end, configured to connect or disconnect an electrical connection between the input end and the output end;
   a leakage current detection module, coupled to the current carrying lines, configured to detect a leakage current signal on the current carrying lines and to generate a detected signal in response to detecting the leakage current signal;
   a leakage current processing module, coupled to the leakage current detection module, configured to receive the detected signal, determine a target gain based on a frequency of the detected signal, gain-process an amplitude of the detected signal using the target gain, compare the gain-processed amplitude to a predetermined threshold, and generate a leakage fault signal based on the comparison; and a drive module, coupled to the switch module and the leakage current processing module, configured to receive the leakage fault signal, and to drive the switch module to disconnect the electrical connection in response to the leakage fault signal.

2. The leakage current detection and interruption device of claim 1, wherein the leakage current processing module includes:

a first leakage current processing unit, configured to receive and process a first signal which is a portion of the detected signal within a first frequency range; and a second leakage current processing unit, configured to receive and process a second signal which is another portion of the detected signal within a second frequency range.

3. The leakage current detection and interruption device of claim 2, wherein the first leakage current processing unit includes a leakage current processing chip, and the second leakage current processing unit includes a microprocessor unit.

4. The leakage current detection and interruption device of claim 3, wherein the leakage current detection module includes a first filter circuit, configured to filter the detected signal and then input it to the leakage current processing chip, wherein the leakage current processing chip is configured to gain-process the filtered signal and then input it to the microprocessor unit.

5. The leakage current detection and interruption device of claim 3, wherein the leakage current detection module includes an operational amplifier and a second filter circuit, wherein the operational amplifier is configured to amplify the detected signal and input the amplified signal to the microprocessor unit, wherein the second filter circuit is configured to filter the amplified signal and input the filtered signal to the leakage current processing chip.

6. The leakage current detection and interruption device of claim 1, further comprising:

a self-test module, coupled to the leakage current detection module and the drive module, configured to generate a self-test signal and input it to the leakage current detection module, and to control the drive module to drive the switch module to disconnect the electrical connection in response to a malfunction of the leakage current detection module, the leakage current processing module, or the drive module.

7. The leakage current detection and interruption device of claim 6, wherein the current carrying lines include a first current carrying line connected to a hot line of a power source and a second current carrying line connected to a neutral line of the power source, wherein the drive module includes a trip solenoid and a silicon controlled rectifier, a first end of the trip solenoid is couple to the first current carrying line, a second end of the trip solenoid is couple to the silicon controlled rectifier, wherein the self-test module includes a protection diode and a protection resistor, the second end of the trip solenoid is coupled to a control gate of the silicon controlled rectifier via the protection diode and the protection resistor, wherein when the leakage current processing module malfunctions, a current flows through a path from the first current carrying line via the trip solenoid, the protection diode and the protection resistor to trigger the silicon controlled rectifier to conduct, which in turn drives the switch module to disconnect the electrical connection between the input and output ends.

8. The leakage current detection and interruption device of claim 6, wherein the self-test module includes:

a microprocessor unit, coupled to the leakage current detection module, configured to periodically outputs a simulated leakage current signal to the leakage current detection module and to receive a corresponding feedback signal from the leakage current detection module, wherein in response to a malfunction in the leakage current detection module and/or the leakage current processing module, the microprocessor unit outputs a self-test fault signal to control the drive module to drive the switch module to disconnect the electrical connection between the input and output ends.

9. The leakage current detection and interruption device of claim 8, wherein the self-test module further includes a self-test resistor, coupled to the microprocessor unit, configured to pre-adjust a value of the simulated leakage current signal.

10. The leakage current detection and interruption device of claim 1, wherein the leakage current processing module includes a leakage current processing chip, configured to: receive the detected signal, determine the target gain based on the frequency of the detected signal, gain-process the amplitude of the detected signal using the target gain, compare the gain-processed amplitude to the predetermined threshold, and generate the leakage fault signal based on the comparison.

* * * * *